(12) United States Patent
Bernhardt et al.

(10) Patent No.: US 6,802,712 B2
(45) Date of Patent: Oct. 12, 2004

(54) HEATING SYSTEM, METHOD FOR HEATING A DEPOSITION OR OXIDATION REACTOR, AND REACTOR INCLUDING THE HEATING SYSTEM

(75) Inventors: Henry Bernhardt, Dresden (DE); Thomas Seidemann, Dresden (DE); Michael Stadtmueller, Dresden (DE)

(73) Assignees: Infineon Technologies SC300 GmbH & Co. KG, Dresden (DE); Aviza Technology, Inc., Scotts Valley, CA (US)

( * ) Notice: Subject to any disclaimer, the term of this patent is extended or adjusted under 35 U.S.C. 154(b) by 0 days.

(21) Appl. No.: 10/685,062

(22) Filed: Oct. 14, 2003

(65) Prior Publication Data

US 2004/0157183 A1 Aug. 12, 2004

Related U.S. Application Data

(63) Continuation of application No. PCT/EP02/04060, filed on Apr. 11, 2002.

(30) Foreign Application Priority Data

Apr. 12, 2001 (EP) ............................................. 01109164

(51) Int. Cl.$^7$ ................................................ F27D 1/10
(52) U.S. Cl. ........................ 432/247; 118/725; 392/416; 392/418
(58) Field of Search ............................... 432/4, 93, 94, 432/178, 207, 245, 247; 118/715, 724, 725; 392/416, 418; 219/390, 405

(56) References Cited

U.S. PATENT DOCUMENTS 4,954,685 A * 9/1990 Kumagai et al. ............ 219/390
5,259,883 A * 11/1993 Yamabe et al. ............. 118/725
5,418,885 A * 5/1995 Hauser et al. ............... 392/416
5,635,409 A    6/1997 Moslehi
5,775,889 A    7/1998 Kobayashi et al.
6,441,350 B1 * 8/2002 Stoddard et al. ............ 219/497
6,495,805 B2 * 12/2002 Sakamoto et al. .......... 219/483
6,548,378 B1    4/2003 Boness et al.
6,572,371 B1 * 6/2003 Sion et al. .................. 432/247

FOREIGN PATENT DOCUMENTS

| EP | 0 538 874 A1 | 4/1993 |
| EP | 1 187 188 A1 | 3/2002 |
| WO | 00/39840 | 7/2000 |

* cited by examiner

Primary Examiner—Gregory Wilson
(74) Attorney, Agent, or Firm—Laurence A. Greenberg; Werner H. Stemer; Gregory L. Mayback

(57) ABSTRACT

A heating system, a method for heating a deposition reactor or an oxidation reactor, and a reactor utilizing the heating system are particularly suited for low-pressure chemical vapor deposition or oxidation. A heating system is particularly useful for heating a reactor in which a plurality of wafers is held perpendicularly to the reactant gas flowing direction that is parallel to the longitudinal axis of the reactor, to enable a deposition or oxidation reaction. The heating system is adapted to change the reactor temperature during the process. In addition, a method heats a reactor to enable a reaction. Preferably, each of a plurality of reactor zones, into which the reactor is divided in a direction parallel to the reactant gas flowing direction, is heated at a different temperature profile indicating the temperature of this specific zone versus time. Thereby, the in-plane uniformity of deposited or oxidized layers can be largely improved.

11 Claims, 3 Drawing Sheets

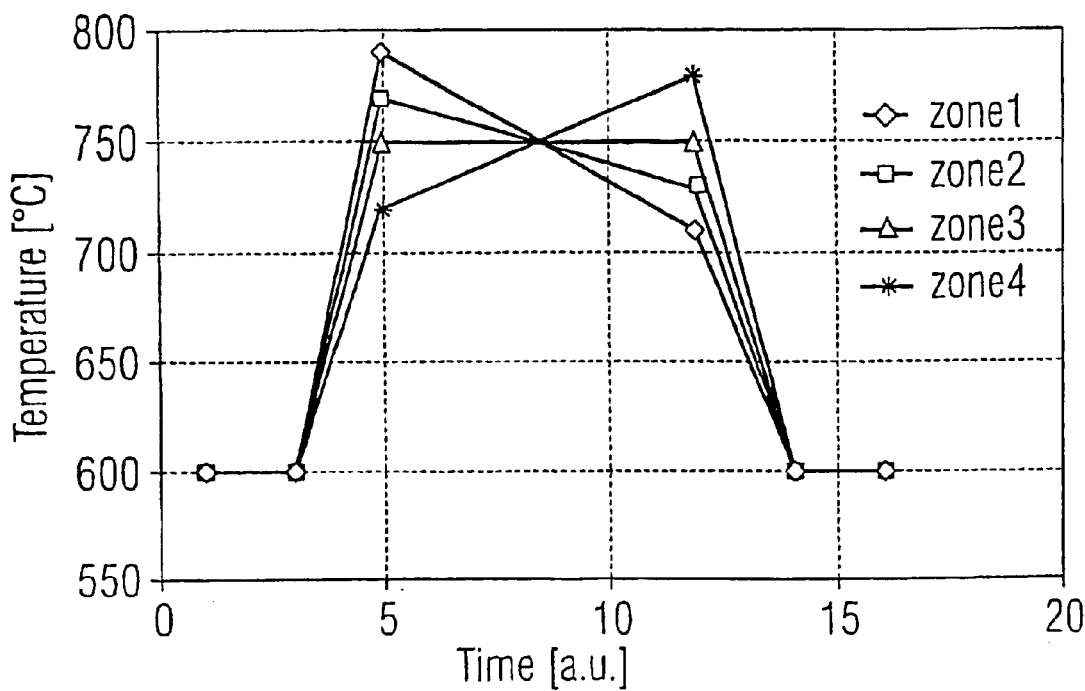
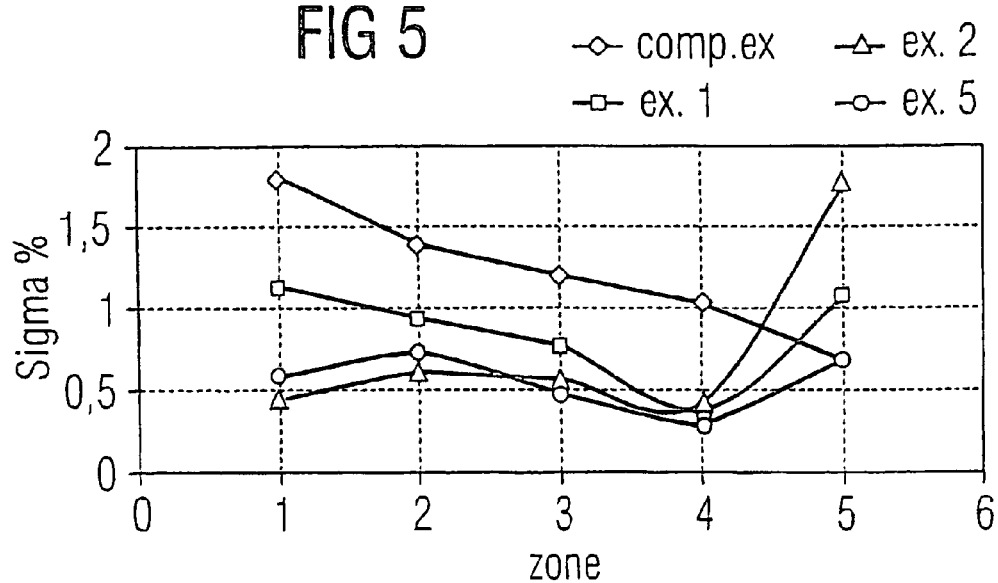

HEATING SYSTEM, METHOD FOR HEATING A DEPOSITION OR OXIDATION REACTOR, AND REACTOR INCLUDING THE HEATING SYSTEM

CROSS-REFERENCE TO RELATED APPLICATION

This application is a continuation of copending International Application No. PCT/EP02/04060, filed Apr. 11, 2002, which designated the United States and was published in English.

BACKGROUND OF THE INVENTION

FIELD OF THE INVENTION

The present invention relates to a heating system, a reactor, and a method for heating a reactor for one of deposition and oxidation.

During the manufacture of integrated circuits such as memory product substrates, especially semiconductor wafers, are processed in high-temperature ovens, called reactors, in order to deposit layers of isolating, semiconducting or conducting material. These reactors can be suited for the processing of a plurality of wafers at one time. The wafers are placed on a wafer support inside the reactor. The deposition reactor and, thus, the wafers are heated to a desired temperature. Typically, reactant gases are passed over the heated wafer, causing the chemical vapor deposition of a thin layer of the reactant material on the wafer. Alternatively, reactant gases passing over the heated wafer will immediately react with the substrate material, as is the case in thermal oxidation.

FIG. 1 shows an exemplary deposition reactor that is suited for low-pressure chemical vapor deposition processes. A large number of wafers (typically at least 100) is carried by a wafer carrier, for example a slotted quartz boat, so that the gas flowing direction, which is defined by the line connecting gas inlet and gas outlet and which is parallel to the longitudinal axis of the reactor, is orthogonal to the wafer surfaces. Heating means are provided in order to heat the reactor to a predetermined temperature. As soon as the predetermined temperature is reached, the reactant gases are introduced into the deposition reactor in order to effect the deposition reaction. According to the prior art method, the temperature of the deposition reactor is maintained constant during deposition.

In order to deposit silicon dioxide, for example TEOS, $(Si(OC_2H_5)_4)$ is reacted at a temperature of 700° C. and a pressure of 40 Pa. Silicon nitride layers can be generated by reacting $SiH_2Cl_2$ and $NH_3$ at a temperature of 750° C. and a pressure of 30 Pa.

As is generally known, the deposition rate depends on the deposition temperature and the pressure inside the deposition reactor. More specifically, a higher deposition temperature results in a higher deposition rate. Accordingly, usually a temperature gradient is applied in a direction parallel to the gas flowing direction in order to compensate for the depletion of the reactant gases in that direction. Consequently, the temperature at the reactant gas outlet is higher than the temperature at the reactant gas inlet. By these measures, it is possible to deposit a homogenous layer thickness onto all wafers that are simultaneously processed.

However, it is not possible to achieve a sufficient in-plane uniformity of the layer thickness. More specifically, the layers on the wafers close to the gas outlet tend to assume a bowl shape in which the layer thickness at the edge of the wafer is greater than the layer thickness in the middle of the wafer. Typically, the difference between layer thickness at the edge and layer thickness in the middle is approximately 10 nm at a mean value of the layer thickness of 200 nm. On the other side, the layers on the wafer close to the gas inlet tend to assume a pillow shape in which the layer thickness at the edge of the wafer is smaller than the layer thickness in the middle of the wafer.

U.S. Pat. No. 5,775,889 to Kobayashi et al. discloses a reactor for high temperature treatment of semiconductor wafers. The wafers are held perpendicularly with respect to a reactant gas flow direction parallel to a longitudinal axis of the reactor. The heating system performs a rising and falling temperature profile during wafer processing in order to avoid crystal defects called slip. When the reaction tube has reached about 1,100° C., oxidation gases are fed into the reaction tube.

International patent application no. WO 00/39840 discloses a vertical oven system for boron doping of semiconductor wafers. The wafers are vertically disposed. The oven includes several temperature zones that can be heated independently.

To provide a heating system and a method for heating a reactor for one of deposition and oxidation by which the in-plane uniformity of the deposited or oxidized layer thickness is improved.

SUMMARY OF THE INVENTION

It is accordingly an object of the invention to provide a heating system, a method for heating a deposition or oxidation reactor, and a reactor including the heating system that overcome the hereinafore-mentioned disadvantages of the heretofore-known devices and methods of this general type and that improve the in-plane uniformity of the deposited layers by changing the reactor temperature during the deposition process.

With the foregoing and other objects in view, there is provided, in accordance with the invention, a heating system adapted to change a temperature within a reactor during processing. The heating system includes a plurality of heating elements. The plurality of heating elements correspond to the plurality of reactor zones. Each of the plurality of heating elements correspond to a given one of the plurality of reactor zones. The reactor zones are adapted to perform a temperature behavior according to a temperature profile versus time. A heating element corresponding to a zone nearest the gas inlet is adapted to perform a temperature behavior according to a temperature profile that rises during the process. A heating element corresponding to a zone nearest the gas outlet is adapted to perform a temperature behavior according to a temperature profile that falls during the process.

With the objects of the invention in view, there is also provided a reactor that includes the above-described heating system. With the objects of the invention in view, there is also provided a method for heating a reactor during a process involving one of deposition and oxidation of a plurality of semiconductor wafers. The method includes providing a reactor having a gas inlet for feeding at least one reactant gas, a gas outlet for exhausting the at least one reactant gas, a longitudinal axis between the gas inlet and the gas outlet, and a plurality of reactor zones along the longitudinal axis. The next step is holding a plurality of wafers perpendicularly to a reactant gas flow direction aligned parallel to the longitudinal axis to enable the process. The next step is heating each of the reactor zones according to different temperature profiles versus time during the process. The next step is increasing a temperature of a given one of the reactor zones nearest the gas inlet during the process. The next step is decreasing the temperature of a given one of the reactor zones nearest the gas outlet during the process.

Accordingly, in the embodiments of the invention, the reactor temperature is no longer held at a constant value but it is changed. For example, the temperature can be lowered, raised, or changed in an arbitrary manner. Exemplary temperature profiles that are applied in all the zones of the reactor are illustrated in FIGS. 2 and 3. As is shown in FIG. 2, the temperature is ramped down by 40 K, whereas in FIG. 3, during deposition that starts at point A and ends at point B, the temperature is first ramped up by 60 K and then again ramped down by 60 K. The time is depicted in arbitrary units (a.u.). It is to be noted that deposition and oxidation are exchangeable in this invention. A feature of the invention that is described for a deposition reaction can equally be used for an oxidation reaction.

According to a preferred embodiment, the deposition (or oxidation) reactor is divided into a plurality (usually five) of zones along the reactant gas flowing direction. The heating system is divided into heating elements and each of the heating elements is separately controlled so as to provide a different temperature profile indicating the temperature of the specific temperature element versus time as is shown schematically in FIG. 4. The number of heating elements can be the same as the number of zones. As can be seen from FIG. 4, in zone 1, which is close to the gas outlet, the temperature is ramped down from 790° C. to 710° C., in zone 2 the temperature is ramped down from 770° C. to 730° C., in zone 3 the temperature is maintained constant at 750° C., and in zone 4, which is close to the gas inlet, the temperature is ramped up from 720° C. to 780° C.

Generally stated, the temperature is ramped down in the two thirds of the reactor that are closer to the gas outlet. It is preferred that the difference between deposition starting temperature and deposition end temperature is greater in a zone closer to the gas outlet than in a zone closer to the gas inlet. Moreover, the temperature is ramped up in the third of the reactor that is closest to the gas inlet. In the zone forming the boundary between these regions, the temperature is maintained constant during deposition. The temperature profiles during a deposition process within each zone differ from each other. The temperature profile in at least one of the zones is varying over deposition time according to a predefined profile or rate. The temperature profile can be constant in at least one of the zones, and must be varying in at least another one of the zones over deposition time. Preferably, the temperature profiles of two ones of the zones do not behave in parallel to each other.

By these measures, it is possible to adjust the optimum deposition temperature in accordance with the deposition conditions that vary in dependence from the location of the specific reactor zone. In particular, the reactant gases are depleted along the reactant gas flowing direction. Moreover, in a zone closer to the gas outlet the reactant gases are as well depleted in a direction parallel to the wafer surface so that the reactant gases are most depleted in the middle of the wafers. In the zones close to the gas inlet, in particular, in the zones located in the lower third of the reactor, this effect is less important since in these zones the effect of the depletion of the reactant gases along the reactant gas flowing direction is not so strong.

Another relevant parameter is the heat flow in a direction of the wafer surface. Generally, heat is supplied by using a heating spiral or heating lamp that is situated at the reactor walls. Accordingly, a certain temperature of the zone of the deposition reactor refers to the temperature at the wafer edge. In addition, in most commonly used deposition reactors, at a position closest to the gas inlet, redundant heating elements are provided at a position where no wafer is placed. Accordingly, in the zone closest to the gas inlet, the heating is not only effected from the wafer edge but also from the middle of the wafer. Therefore, dependent from the specific location of the zone, different heating conditions will prevail.

More specifically, in the zones that are not closest to the gas inlet, the temperature at the wafer edge is different from the temperature in the middle of the wafer. Accordingly, by lowering the temperature of the reactor, a uniform heating amount can be achieved along the wafer surface.

On the other hand, in the zone closest to the gas inlet, the heating is not only effected from the edge as explained above. Therefore, by raising the temperature of the reactor during the deposition, a uniform heating amount can be achieved along the wafer surface.

The effects of the present invention can be further improved if the temperature profiles of the zones are properly set so that the temperature profiles of neighboring zones do not cross each other during the deposition process. Stated more concretely, the elevation of the temperature of one zone should be avoided, if at the same time the temperature of a neighboring zone is lowered in order to minimize a detrimental heat flow between the zones.

The detrimental heat flow can be best suppressed if the deposition process ends at the same temperature in all zones.

Since different deposition reactors require different heating conditions, a calibration can be performed, as soon as a new batch of wafers has been processed. To this end, after the end of the deposition, the wafers of each zone are evaluated, for example using an ellipsometer. Thereafter, based on the measurement results obtained, the heating conditions for the zones of the reactor are set for the next deposition processes. If the deposited layer has assumed a bowl shape, the difference between deposition start temperature and deposition end temperature must be increased in that specific zone. On the contrary, if the deposited layer assumes a pillow shape, the difference between deposition start temperature and deposition end temperature must be decreased in that specific zone.

In order to deposit the same layer thickness onto the wafers in all the zones, it is preferred that the mean value of the temperature taken over time in each of the zones is decreasing from the zone closest to the gas outlet to the zone closest to the gas inlet. For example, zone 1 assumes a mean temperature of 800° C., zone 2 assumes a mean temperature of 790° C., zone 3 assumes a mean temperature of 780° C., zone 4 assumes a mean temperature of 770° C., and zone 5 assumes a mean temperature of 760° C. This is preferred when the temperature is equally changed in all the zones, for example, lowered by a certain amount, raised by a certain amount or changed in an arbitrary manner, or when the temperature profile of every zone is changed in a different manner.

In summary, the present invention provides the following advantages:

The in-plane uniformity of the deposited layers is largely improved. In particular, a difference between the layer thickness at the edge and the layer thickness in the middle of the wafer amounts to 4 nm at most if the mean value of the layer thickness amounts to 200 nm.

The present invention can easily be implemented to existing deposition reactors.

As is generally known, by raising the pressure inside the deposition reactor, the deposition rate can be raised. However, a high pressure will also result in very inhomogeneous layers. By additionally regulating the temperature in accordance with the present invention, the homogeneity of the layers will be improved. Accordingly, when the present invention is applied to a deposition process that is performed at an elevated pressure, the deposition rate is raised and, simultaneously, the quality of the layers in terms of their homogeneity is maintained.

The present invention can be applied to all low-pressure chemical vapor deposition processes. It is particularly applicable to the deposition of silicon nitride, silicon dioxide (TEOS process and thermal oxidation), arsene oxide (TEAS process) and polysilicon layers. The advantageous effects of the present invention become especially apparent at a layer thickness of at least 30 nm. If the layer thickness is smaller, the advantages become less apparent.

Other features that are considered as characteristic for the invention are set forth in the appended claims.

Although the invention is illustrated and described herein as embodied in a heating system, a method for heating a deposition or oxidation reactor, and a reactor including the heating system, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 2, 3, and 4 are temperature profiles applied to the deposition reactor plotting temperature versus time; and FIG. 5 is a graph showing the measurement results representing the uniformity of layers deposited in accordance with the examples and the comparative example.

DESCRIPTION OF THE PREFERRED EMBODIMENTS

Figure 1:
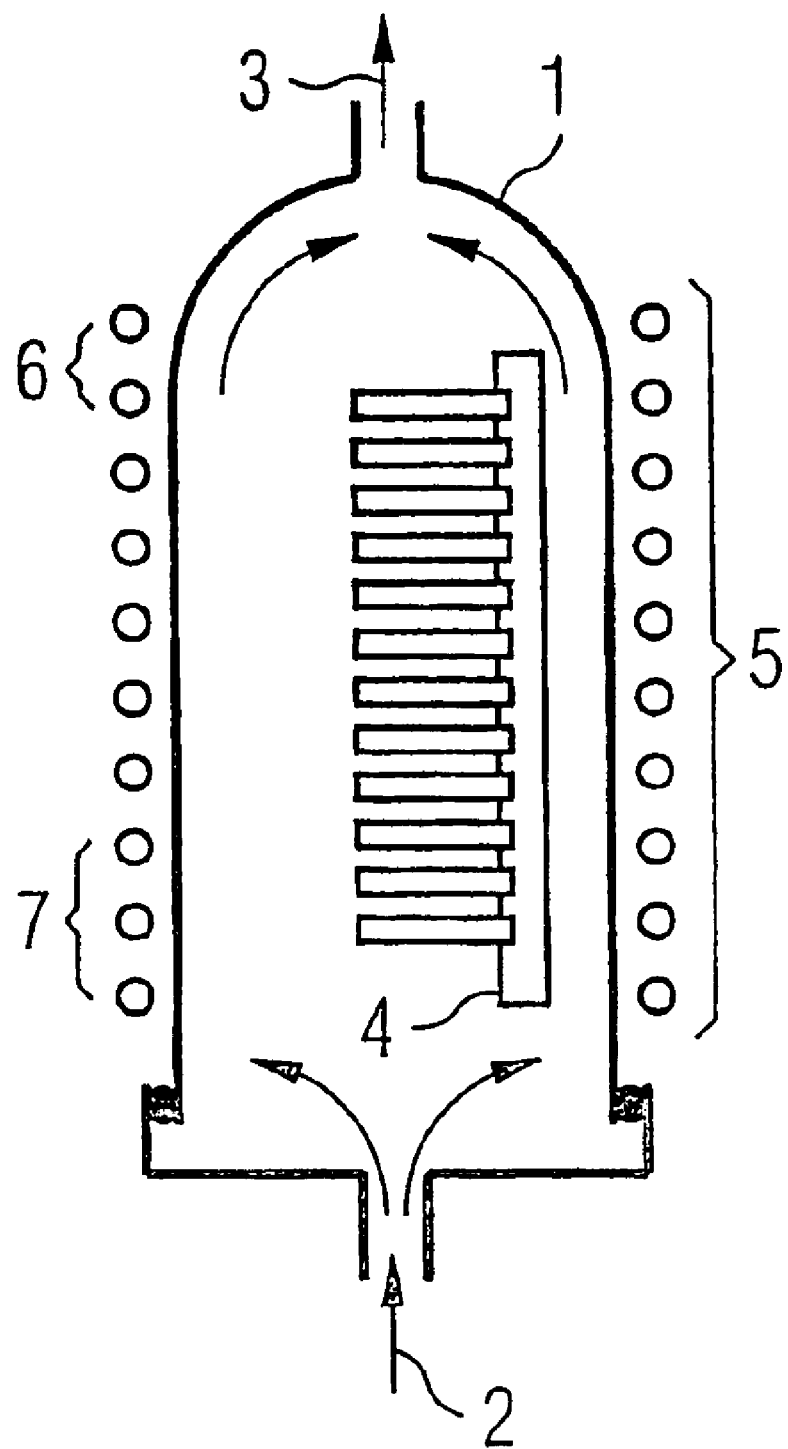
FIG. 1 is a sectional view of a CVD reactor that can be used for implementing the present invention.
Figure 2:
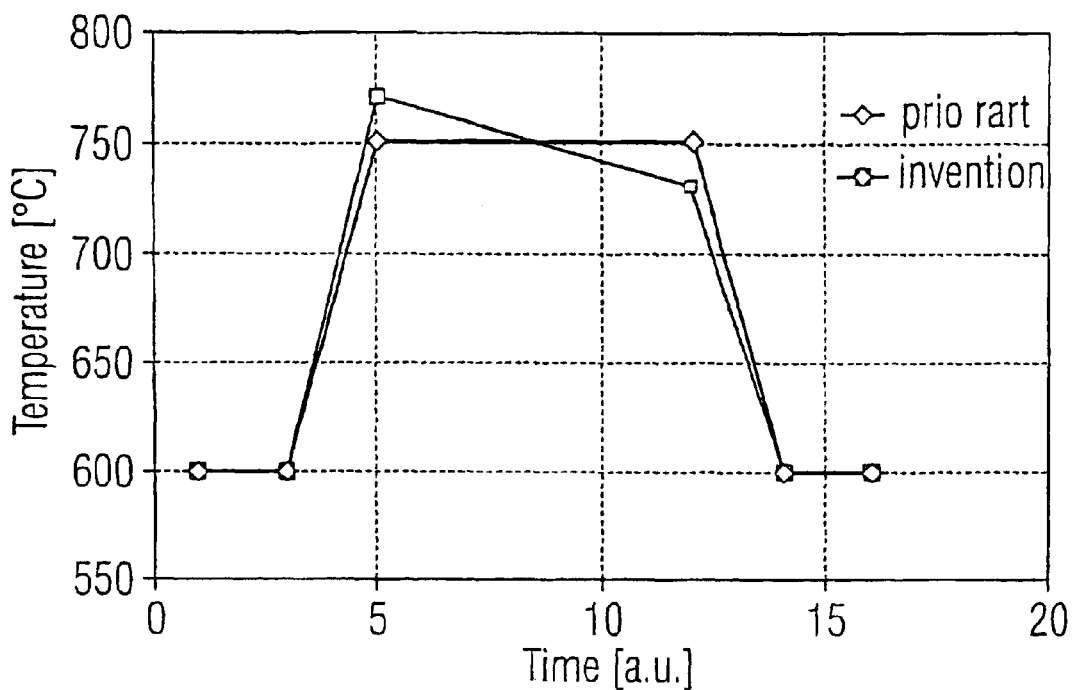
Figure 3:
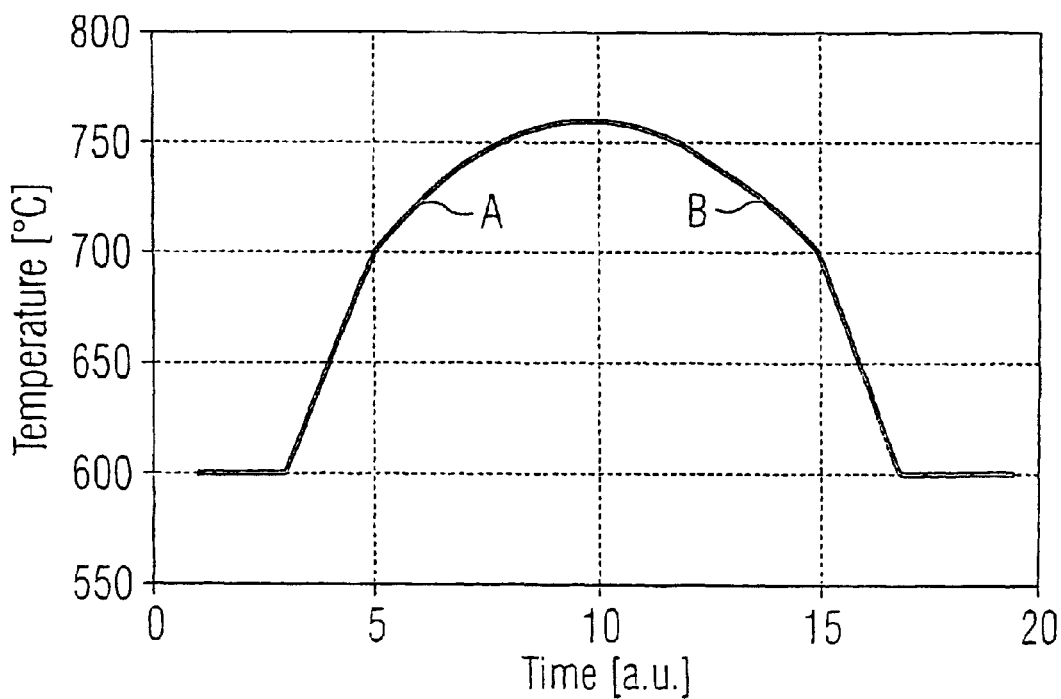

Referring now to the figures of the drawings in detail and first, particularly to FIG. 1 thereof, there is shown a deposition reactor 1 in which the low pressure chemical vapor deposition takes place and which is implemented as a batch furnace. Reference numeral 2 denotes gas inlet for feeding one or more reactant gases to the deposition reactor, and reference numeral 3 denotes a gas outlet for exhausting the reactant gases. As is obvious, the reactant gas flowing direction is parallel to the longitudinal axis of the reactor. Reference numeral 4 denotes a wafer carrier for carrying a plurality (usually between 100 and 150) of wafers, and reference numeral 5 denotes a heating system for heating the deposition reactor.

The reactor may be divided into 5 zones, zone 1 to zone 5, wherein zone 1 is the zone closest to the gas outlet, whereas zone 5 is the zone closest to the gas inlet. In FIG. 1, reference numeral 6 denotes zone 1 and reference numeral 7 denotes zone 5.

In the present examples, a pad nitride layer is to be deposited onto silicon wafers. After that, trenches for defining storage capacitors for DRAM cells are to be etched into these wafers.

After introducing the wafers into the deposition reactor, the reactor is evacuated, and the temperature thereof is raised. Usually, the reactor is held at a standby temperature of approximately 650° C. so that the temperature is to be increased by about 100 to 250° C. depending on the chosen reaction conditions. As soon as a desired vacuum degree is reached, a first reactant gas is fed into the reactor. In the present case, $NH_3$ at a flow rate of 480 sccm (standard cubic centimeters per second) is fed into the reactor. As soon as the desired deposition temperature is reached, a second reactant gas, which is $SiH_2Cl_2$ at a flow rate of 120 sccm, is fed into the reactor so that the deposition reaction will start. A typical pressure inside the deposition reactor amounts to 14.63 Pa (110 mTorr).

The temperatures at which the deposition starts and the temperature profiles during deposition are varied in accordance with the following examples and the comparative example. Because the temperature profiles are selected so that the mean temperature amounts to 800° C. in zone 1, 790° C. in zone 2, 780° C. in zone 3, 770° C. in zone 4, and 760° C. in zone 5, the deposition rate amounts to 2 nm/min.

The layers are deposited at a mean value of the thickness of 200 nm within a time period of 100 minutes.

EXAMPLE 1

The reactor is brought to a temperature of 820° C. in zone 1, 810° C. in zone 2, 800° C. in zone 3, 790° C. in zone 4, and 780° C. in zone 5. During deposition, the reactor temperature is ramped down by 40 K in all the zones.

EXAMPLE 2

The reactor is brought to a temperature of 840° C. in zone 1, 830° C. in zone 2, 820° C. in zone 3, 810° C. in zone 4, and 800° C. in zone 5. During deposition, the reactor temperature is ramped down by 80 K in all the zones.

EXAMPLE 3

The reactor is brought to a temperature of 840° C. in zone 1, 830° C. in zone 2, 820° C. in zone 3, a temperature of 790° C. in zone 4 and a temperature of 760° C. in zone 5. During deposition, the temperature is ramped down by 80 K in zones 1 to 3, the temperature is ramped down by 40 K in zone 4, and it is held constant in zone 5.

EXAMPLE 4

The reactor is brought to a temperature of 840° C. in zone 1, 830° C. in zone 2, 810° C. in zone 3, 790° C. in zone 4 and 750° C. in zone 5. During deposition, the temperature is ramped down by 80 K in zones 1 and 2, the temperature is ramped down by 60 K in zone 3, the temperature is ramped down by 40 K in zone 4, and the temperature is ramped up by 20 K in zone 5.

EXAMPLE 5

The reactor is brought to a temperature of 840° C. in zone 1, 830° C. in zone 2, 820° C. in zone 3, 785° C. in zone 4, and 740° C. in zone 5. During deposition, the temperature is ramped down by 80 K in zones 1 to 3, the temperature is ramped down by 30 K in zone 4, and the temperature is ramped up by 40 K in zone 5.

EXAMPLE 6

The reactor is brought to a temperature of 841° C. in zone 1, 832° C. in zone 2, 820° C. in zone 3, 790° C. in zone 4 and 734° C. in zone 5. During deposition, the temperature is ramped down by 82 K in zone 1, the temperature is ramped down by 84 K in zone 2, the temperature is ramped down by 80 K in zone 3, the temperature is ramped down by 40 K in zone 4, and the temperature is ramped up by 52 K in zone 5.

Comparative Example

The reactor is brought to a temperature of 800° C. in zone 1, 790° C. in zone 2, 780° C. in zone 3, 770° C. in zone 4, and 760° C. in zone 5. During deposition, the temperature is held constant in all zones.

When the deposition reaction is finished, the flow of the reactant gases is interrupted and the reactor is rinsed with an inert gas such as nitrogen.

Thereafter, the quality of the deposited layers is evaluated as follows. The standard deviation from the mean value of the layer thickness based on 13 measurement points on the wafer surface is determined for each of the examples and the comparative example, and the results represented by uniformity sigma % are given in the following table:

| Example | zone 1 [%] | zone 2 [%] | zone 3 [%] | zone 4 [%] | zone 5 [%] |
|---|---|---|---|---|---|
| 1 | 1.14 | 0.92 | 0.77 | 0.37 | 1.07 |
| 2 | 0.45 | 0.61 | 0.54 | 0.41 | 1.78 |
| 3 | 0.49 | 0.59 | 0.22 | 0.17 | 0.95 |
| 4 | 0.64 | 0.74 | 0.67 | 0.31 | 0.85 |
| 5 | 0.58 | 0.73 | 0.47 | 0.32 | 0.69 |
| 6 | 0.71 | 0.73 | 0.57 | 0.29 | 0.66 |
| comparative | 1.78 | 1.38 | 1.19 | 1.03 | 0.69 |

The measurement results for examples 1, 2, 5 and the comparative example are illustrated in FIG. 5.

As can be seen from the table, all of the examples provide a layer thickness having an improved in-plane uniformity in zones 1 to 4, whereas only examples 5 and 6 provide an improved uniformity in zone 5.

However, since in normally used deposition reactors the positions of the wafer carrier of zone 5 closest to the gas inlet and the positions of the wafer carrier of zone 1 closest to the gas outlet are occupied by dummy wafers that are not used for chip production, the deteriorated in-plane uniformity in zone 5 is of minor relevance for the chip production.

In summary, the present invention provides improved results in examples 1 to 4 and excellent results in examples 5 and 6.

We claim:

1. In a reactor having a gas inlet for feeding at least one reactant gas, a gas outlet for exhausting the at least one reactant gas, a longitudinal axis defined between the gas inlet and the gas outlet, a reactant gas flow direction defined parallel to the longitudinal axis, and a plurality of reactor zones defined along the longitudinal axis, and being used for a process involving one of deposition and oxidation of a plurality of semiconductor wafers being held perpendicularly to the reactant gas flow direction, a heating system adapted to change a temperature within the reactor during the process, comprising:

a plurality of heating elements corresponding to the plurality of reactor zones, each of said plurality of heating elements corresponding to a given one of the plurality of reactor zones being adapted to perform a temperature behavior according to a temperature profile versus time, a heating element corresponding to a zone nearest the gas inlet being adapted to perform a temperature behavior according to a temperature profile rising during the process, and a heating element corresponding to a zone nearest the gas outlet being adapted to perform a temperature behavior according to a temperature profile falling during the process.

2. The heating system according to claim 1, wherein at least two of said plurality of heating elements corresponding to zones closest to the gas outlet are adapted to perform temperature behavior according to respective temperature profiles, a given one of said at least two of said plurality of heating elements closer to the heating gas outlet having a greater difference than a given one of said at least two of said plurality of heating elements closer to the gas inlet.

3. The heating system according to claim 2, wherein:

said plurality of heating elements includes at least four heating elements each corresponding to a respective reactor zone;

a first of said heating elements is disposed nearest the gas inlet and performs a temperature behavior according to the temperature profile that rises during the process;

a second of said heating elements is disposed between said first heating element and the gas outlet and performs a temperature behavior according to a temperature profile that is maintained constant during the process;

a third of said heating elements is disposed between said second heating element and the gas outlet; and a fourth of said heating elements is disposed between said third heating element and the gas outlet;

said third and fourth heating elements each performing a temperature behavior according to a temperature profile that falls during the deposition or oxidation process.

4. The heating system according to claim 1, wherein said temperature profiles of neighboring zones of the plurality of heating zones do not cross each other during the process.

5. The heating system according to claim 4, wherein said plurality of heating elements are adapted to provide an identical end temperature of the process in each of the plurality of heating zones.

6. A method for heating a reactor during a process involving one of deposition and oxidation of a plurality of semiconductor wafers, which comprises:

providing a reactor having a gas inlet for feeding at least one reactant gas, a gas outlet for exhausting the at least one reactant gas, a longitudinal axis between the gas inlet and the gas outlet, and a plurality of reactor zones along the longitudinal axis;

holding a plurality of wafers perpendicularly to a reactant gas flow direction aligned parallel to the longitudinal axis to enable the process;

heating each of the reactor zones according to different temperature profiles versus time during the process;

increasing a temperature of a given one of the reactor zones nearest the gas inlet during the process; and decreasing the temperature of a given one of the reactor zones nearest the gas outlet during the process.

7. The method according to claim 6, which further comprises decreasing a temperature of at least two of the reactor zones nearest the gas outlet to make a difference between a process start temperature and a process end temperature greater in a given one of the reactor zones nearer the gas outlet than in a given one of the reactor zones nearer the gas inlet.

8. The method according to claim 6, which further comprises defining the temperature profiles of neighboring zones not to cross each other during the process.

9. The method according to claim 8, which further comprises ending the temperature profiles of the process of the heating zones at a single identical temperature.

10. The method according to claim 6, which further comprises:

provibefore a heating system for heating the reactor;

dividing the heating system into at least four heating elements, each corresponding to a respective one of the reactor zones;

disposing a first of the heating elements nearest the gas inlet;

disposing a second of the heating elements between the first heating element and the gas outlet;

disposing a third of the heating elements between the first heating element and the gas outlet;

disposing a fourth of the heating elements between the third heating element the gas outlet;

performing a temperature behavior with the first heating element according to a temperature profile that rises during the process;

performing a temperature behavior with the second heating element according to a temperature profile that is maintained constant during the process; and performing a temperature behavior with each of the third and the fourth heating elements according to a temperature profile that falls during the process.

11. A reactor, comprising:

a gas inlet for feeding at least one reactant gas;

a gas outlet for exhausting the at least one reactant gas;

a longitudinal axis being defined between said gas inlet and said gas outlet;

a reactant gas flow direction being defined parallel to said longitudinal axis;

a plurality of reactor zones disposed along said longitudinal axis, and being used for a process involving one of deposition and oxidation of a plurality of semiconductor wafers being held perpendicularly to said reactant gas flow direction;

a heating system adapted to change a temperature within during the process, including:

a plurality of heating elements corresponding to said plurality of reactor zones, each of said plurality of heating elements corresponding to a given one of said plurality of reactor zones being adapted to perform a temperature behavior according to a temperature profile versus time, a heating element corresponding to a zone nearest said gas inlet being adapted to perform a temperature behavior according to a temperature profile rising during said process, and a heating element corresponding to a zone nearest said gas outlet being adapted to perform a temperature behavior according to a temperature profile falling during said process.

* * * * *